Sept. 22, 1964 A. P. WEINER 3,150,338

FINE TUNING APPARATUS FOR A TELEVISION RECEIVER

Filed April 11, 1962 2 Sheets-Sheet 1

INVENTOR:
ALBERT P. WEINER,
BY Joseph Levinson
HIS ATTORNEY.

Sept. 22, 1964 A. P. WEINER 3,150,338

FINE TUNING APPARATUS FOR A TELEVISION RECEIVER

Filed April 11, 1962 2 Sheets-Sheet 2

INVENTOR:
ALBERT P. WEINER,

BY Joseph Levinson
HIS ATTORNEY.

United States Patent Office 3,150,338
Patented Sept. 22, 1964

3,150,338
FINE TUNING APPARATUS FOR A TELEVISION RECEIVER
Albert P. Weiner, North Syracuse, N.Y., assignor to General Electric Company, a corporation of New York
Filed Apr. 11, 1962, Ser. No. 186,677
11 Claims. (Cl. 334—51)

This invention relates to television receivers, and more particularly to means for coupling a fine tuning adjusting force between a control panel and a tuner in the receiver.

Various mechanical linkage arrangements are known in the art for coupling a fine tuning rotational force from a fine tuning control knob on a control panel of a television receiver to an electrical element in the tuner. In one arrangement, a fine tuning "memory" is provided in the linkage mechanism for retaining previously made fine tuning adjustments. After an initial fine tuning adjustment has been made for a desired broadcast channel, the tuner may be switched through other broadcast channels without the necessity of readjusting fine tuning when the desired channel is again tuned. These known arrangements providing "memory" fine tuning generally include linkage means which are costly and which do not readily lend themselves to a desirable reduction in the size of television receivers.

It is an object of this invention to provide a relatively less expensive and more compact fine tuning adjusting means for a television receiver than has heretofore been possible.

The referred to "memory" of the mechanical linkage arrangement generally includes a disk having a separate "memory" element associated with each channel. The disk rotates in accordance with rotation of a channel selector shaft, hereinafter referred to as the selector shaft. The longitudinal position of an element on the disk is utilized as an indication of the fine tuning adjustment for the associated channel. In "memory" fine tuning systems of the type described wherein a single fine tuning knob is positioned at the control panel for permitting positional adjustment of the individual "memory" elements by a viewer, the mechanical linkage arrangement between the knob and "memory" element includes means for disengaging the linkage from the rotating "memory" disk during channel selection. The disengagement has heretofore been necessary in order to allow rotation of the "memory" disk and to prohibit disturbance of an adjusted fine tuning "memory" element. This requirement for disengagement during channel selection has necessitated the use of a relatively complex mechanical linkage arrangement between the fine tuning control knob and the "memory" disk.

Accordingly, it is another object of this invention to provide, in a system having a fine tuning "memory" device and a single fine tuning control knob, a relatively less complex mechanical linkage arrangement than has heretofore been provided.

It is a further object of this invention to provide a mechanical linkage arrangement for use with a fine tuning "memory" in a television receiver which eliminates the necessity for providing a linkage disengaging means.

In carrying out this invention, a television receiver tuner is provided and includes a rotatably mounted selector shaft upon which is positioned an annular disk having mounted thereupon a plurality of longitudinally adjustable fine tuning "memory" elements. A single fine tuning adjusting shaft, hereinafter referred to as the tuning shaft, is also provided and is positioned relative to the selector shaft. A mechanical shaft-coupling means is provided for causing the tuning shaft to be simultaneously driven by the selector shaft when the selector shaft is driven in accordance with a rotational channel selection force applied only to it. The shaft-coupling means further provides for independent rotation of the tuning shaft relative to the selector shaft when a fine tuning rotational force is coupled only to the tuning shaft. A fine tuning force coupling means is furnished and provides "driving" engagement between the tuning shaft and a "memory" element associated with a channel being tuned in a manner so as to cause the longitudinal position of the "memory" element to be varied by the fine tuning force. The fine tuning force coupling means further provides "idle" engagement between the tuning shaft and "memory" elements when the selector shaft is being rotated, thereby leaving substantially undisturbed the adjusted longitudinal position of each "memory" element during channel selection.

In one embodiment of my invention, the above referred to mechanical shaft-coupling means for providing the desired relative motions of the shafts comprises a mechanical detent for securing the selector shaft in one of a plurality of channel tuning positions and means providing a frictional coupling force between the shafts. The frictional coupling force is of sufficient magnitude for causing the tuning shaft to rotate when the selector shaft is rotated yet less than a force required to overcome the effect of detent action on the selector shaft. The fine tuning force coupling means comprises a gear train including gear teeth positioned on the tuning shaft, gear teeth associated with each of the "memory" elements and idle gear means for intercoupling the gear teeth of the tuning shaft and gear teeth associated with the "memory" elements. The "memory" elements and associated gear teeth and the geared tuning shaft are arranged for zero relative velocity between the teeth associated with each element and the teeth on the geared tuning shaft when the selector shaft is rotated, thereby permitting channel selection without substantially disturbing the position of a "memory" element.

Further objects, features and the attendant advantages of the present invention will become apparent with reference to the following specification and drawings in which.

Figure 2:
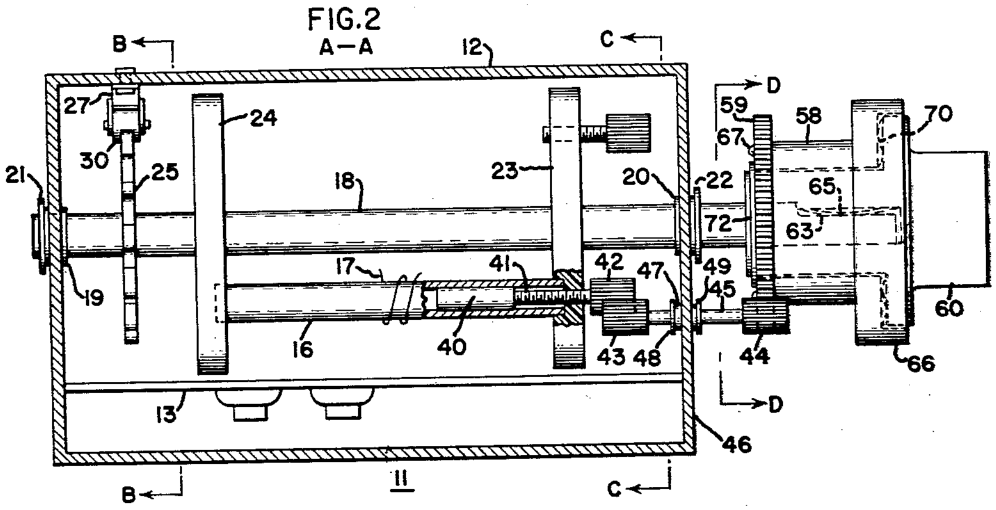
FIGURE 2 is an enlarged view taken along line A—A of the tuner of FIGURE 1.
Figure 3:
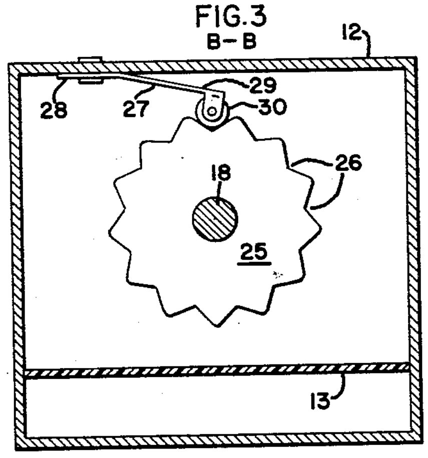
Figure 4:
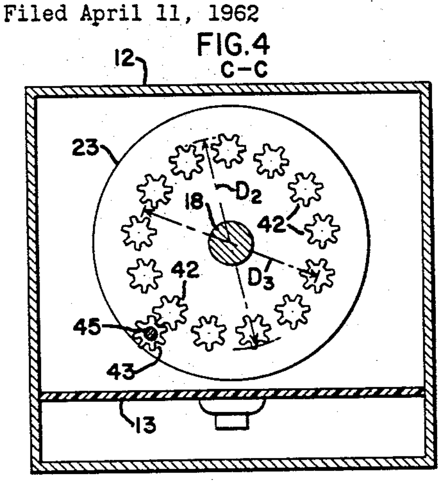
Figure 5:
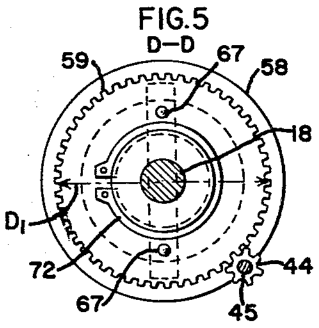
Figure 6:
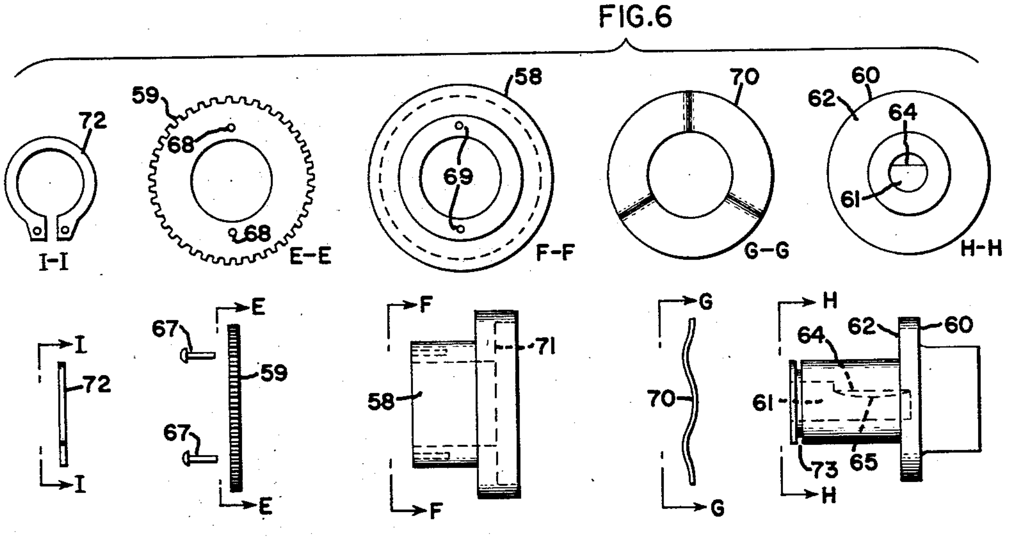
Figure 7:
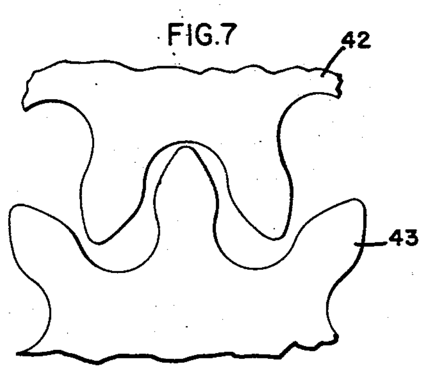

FIGURE 3 is a view taken along line B—B of the tuner of FIGURE 2 and illustrates a mechanical detent mechanism, FIGURE 4 is a view taken along line C—C of the tuner of FIGURE 2 and illustrates a "memory" disk, "memory" elements, and associated idle gear, FIGURE 5 is a view taken along line D—D of the tuner of FIGURE 2 and illustrates a fine tuning gear mounted upon a tuning shaft along with a portion of an associated idle gear, FIGURE 6 is a view of a coaxially positioned channel selector shaft knob, a fine tuning shaft and frictional shaft coupling means in disassembled form together with associated views taken along lines E—E, F—F, G—G, H—H and I—I, and FIGURE 7 illustrates gear teeth arrangement suitable for use in a gear pair utilized in an embodiment of the present invention.

Figure 1:
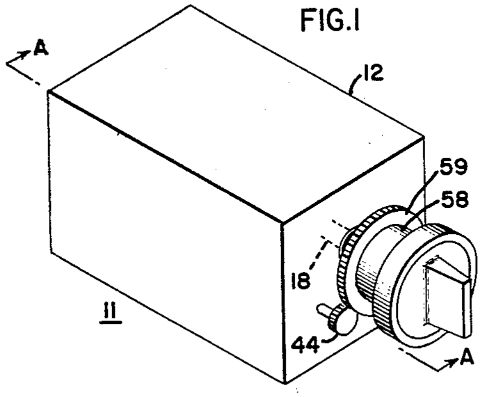
FIGURE 1 is a perspective view of a tuner embodying the present invention.

For a more detailed explanation of one embodiment of the present invention, reference is now made to FIGURES 1 and 2 wherein a turret type television receiver tuner, generally indicated by 11 is shown. Although a turret type tuner is illustrated, it will become apparent during this explanation that other television tuner arrangements, such as a switch type tuner, may be employed in practicing the present invention. The tuner 11 includes a metal enclosure 12 within which the necessary electrical and mechanical components for individually tuning various television broadcast channels are mounted. A large portion of the necessary electrical tuner circuitry for receiving and converting a transmitted television signal to an IF signal, which is well known to those skilled in the art and is therefore not shown in detail, is positioned upon a surface 13. The surface 13 which is mounted within the enclosure 12 may be a printed circuit board.

In order to provide individual selection of different television broadcast channels, conventional turret tuning means is shown which may include a plurality of coil forms having inductances wound thereupon. The coil forms are arranged for positioning an individual form, corresponding to a channel being tuned, in operative relation with the electrical circuits on surface 13. For purposes of clarity, FIGURE 2 illustrates only a single coil form 16, partially cut away, and having coil 17 wound thereupon. It will be understood, however, that other coil forms having inductance wound thereon and necessary for providing tuning of other desired channels will also be provided. The coil 17, and other channel tuning inductances, not shown, which are necessary for providing tuning of a desired channel and normally mounted upon the form 16 are connected to the circuits on surface 13 by any conventional means, not shown, such as sliding contact surfaces.

A means for individually positioning the different coil forms relative to surface 13 for selecting different broadcast channels and for fine tuning a selected channel includes a cylindrical channel selector shaft 18 rotatably mounted on the enclosure 12 by a pair of bearings 19 and 20 and secured in a fixed longitudinal position by a pair of retainiing rings 21 and 22. Positioned upon the shaft 18 and secured by any suitable means, such as a press fit or keyway so as to be rotatable therewith, are a fine tuning "memory" disk 23, a coil form support disk 24, and a detent disk 25. The disks 23 and 24 have slots positioned about their facing surfaces for mounting the coil forms. Thus, when shaft 18 is rotated, different coil forms are individually and successively rotated into operative relation with the circuits on surface 13.

A detent mechanism for securing the shaft 18 and consequently the coil form 16 or any other coil form associated with a desired broadcast channel in a fixed channel tuning position is provided. The detent mechanism, best seen in FIGURE 3, comprises the detent disk 25 which includes a plurality of notches 26 disposed about its peripheral surface and a spring 27. Twelve notches correspond to the presently allocated twelve VHF television tuning channels and a thirteenth notch for UHF tuning or for other desired receiver functions are provided. One end 28 of the spring 27 is secured to a surface of the enclosure 12 while another end 29 of the spring has a rolling bearing surface 30 mounted thereat for providing rolling contact with the peripheral surface of disk 25. When the roller 30 is positioned in a notch 26, the shaft 18 is secured in a fixed position by detent action. When a rotational channel selecting force is coupled to shaft 18, a force exerted by spring 27 may be overcome and the disk 25 may be rotated to a succeeding notch.

In order to provide fine tuning for each channel of the television receiver, an adjustable electrical impedance is provided in the tuner including an adjustable element comprising the fine tuning slug 40 of ferromagnetic material, as shown in a cut-away portion of coil form 16 in FIGURE 2, and an associated coil 17. By altering the position of the slug with relation to the coil 17, the electrical inductance of the coil is correspondingly changed thereby providing an adjustable electrical quantity for fine tuning the receiver. The slug of FIGURE 2 is shown mounted upon a threaded metal shaft 41. It may be desirable at times to eliminate the ferromagnetic slug 40. By selecting a suitable material for shaft 41, such as aluminum, the shaft itself may provide the necessary fine tuning when it is moved relative to the coil 17. The shaft 41 is shown disposed within a threaded circular aperture in the "memory" disk 23. This aperture might also be so constructed, as is familiar to those versed in the art, to allow the threaded shaft 41 to rotate freely without binding when it reaches two opposite limits of its longitudinal motion. By rotating the shaft 41 about its axis, the longitudinal position of the shaft 41 and the slug 40 relative to the coil is varied. A friction means comprising a gear 42 is shown attached to one end of the shaft 41, by any suitable means such as a press fit, for providing a means for coupling a rotational force to the shaft. If the shaft 41 is arranged to have a sufficiently large diameter, the separate gear 42 may be eliminated and gear teeth 42 may be integrally incorporated into shaft 41 by cutting the gear teeth directly into an end of the shaft. The threaded shaft 41 which is rotated in order to vary its position along its longitudinal axis and which remains in a selected longitudinal position until it is further rotated is hereinafter referred to as the "memory" element. A "memory" element, tuning slug, and gear means 42 are provided for each coil form in the turret tuner shown. When the longitudinal position of each "memory" element has been adjusted to fine tune its associated channel, it becomes unnecessary to further alter the fine tuning of the desired channel when the tuner is rotated to different channel tuning positions. Thus far, I have described an electrical-mechanical arrangement which is well known to those skilled in the art.

Referring now more particularly to the subject of the present invention, a frictional coupling means is provided for coupling a fine tuning force from a single knob on a control panel of the television receiver to a "memory" element associated with a channel being tuned. FIGURE 2 illustrates a fine tuning drive train comprising a gear-train coupling arrangement including an idle gear having dual gears 43 and 44 coaxially mounted on a rotatable gear shaft 45. The shaft 45 is mounted on a wall 46 of the enclosure 12 by a bearing 47 and is maintained in a fixed longitudinal position by retaining rings 48 and 49. A friction surface comprising a fine tuning shaft 58 is positioned coaxially with the selector shaft 18 and has mounted thereupon a fine tuning gear 59. A first gear pair consisting of gears 44, 59 and second gear pair consisting of gears 42, 43 have gear teeth arranged in a manner suitable for meshing as indicated in FIGURES 2, 4, 5 and 7. Since gears 43, 44 and 59 have longitudinally fixed positions, the gear-train will be continuously engaged when the shaft 18 is positioned for tuning a desired channel. Because "memory" elements may be repositioned longitudinally, a rotational force coupled to shaft 58 will be transmitted via the meshed gears to cause the shaft 41 to vary its longitudinal position relative to the fine tuning coil 17. The gears 42 and 43 have relative lengths sufficient for causing the slug 40 to vary through a longitudinal distance for fine tuning of a desired channel.

FIGURE 6 illustrates, in disassembled form, a compact shaft-coupling arrangement utilized in an embodiment of the present invention. A selector knob 60 is provided for coupling a channel selecting rotational force to the selector shaft 18. Knob 60, which includes a semi-circular shaped cavity 61 within its length, and a friction surface 62 is positioned on the shaft 18. Flattened surfaces 63 and 64, on the cylindrical shaft 18 and knob 60 of FIGURES 2 and 6 respectively, mate and a spring 65 secures the knob in position on the shaft. The fine tuning shaft 58 which has an integral shoulder segment 66 which may be utilized as a fine tuning knob at a control panel of the receiver is tubular shaped and positioned concentrically with and about the length of knob 60. The fine tuning gear 59 is attached to the fine tuning shaft 58 by a pair of spikes 67 which are passed through a pair of apertures 68 in the gear 59 and driven into a pair of cavities 69 in the shaft 58. A means comprising a disk spring 70 of any suitable spring metal and having a corrugated surface is also concentrically positioned with knob 60 and shaft 58 and rests, when the shaft coupling arrangement is in assembled form, on a friction surface 71 of shoulder portion 66 of shaft 58 for providing frictional coupling between the shaft 58 and the knob 60. The shaft 58 and knob 60 are held in fixed positional relation by a retaining clip 72 positioned on a groove 73 at one end of knob 60.

The aforementioned detent mechanism and the spring 70 provide frictional forces on the shaft 18 and 58 for causing them to rotate simultaneously when a channel selector rotational force is coupled to knob 60 yet permit shaft 58 to rotate independently when a fine tuning force is coupled only to shaft 58. This result is accomplished by providing a spring 27 for the detent mechanism which exerts on shaft 18 a detenting force $F_1$ of greater magnitude than a frictional force $F_2$ provided by the spring 70 between shaft 58 and knob 60. Slippage will therefore occur between the shafts when a rotational force greater than $F_2$ and less than $F_1$ is coupled to shaft 58. Force $F_2$, although less than $F_1$, nevertheless is of sufficient magnitude for causing shaft 58 to drag and rotate with shaft 18 when a channel selector force is coupled to knob 60.

Since the shaft 58 is in continuous engagement with gear 42 via gears 59, 44, and 43 when the shaft 18 is positioned for channel tuning, and because shaft 58 will rotate during channel selection with shaft 18, rotation of the channel selector knob 60 would appear to undesirably disturb a longitudinal setting of a "memory" element. However, and in accordance with a feature of this invention, the gears 59, 44, 43 and 42 are arranged to permit rotation of shaft 58 while leaving "memory" element adjustments substantially undisturbed.

In order to best explain this feature, reference is now made to FIGURES 4 and 5. In FIGURE 4, the gears 42 of the "memory" elements are shown symmetrically disposed about shaft 18 on the "memory" disk 23. In FIGURE 5 the gear 59 is shown to have a pitch circle of diameter $D_1$. The term "pitch circle," as is well known in the art, is used to indicate the circle of a friction wheel which the gear replaces. A longitudinal axis of each of the "memory" elements of FIGURE 4 is positioned on a circle on "memory" disk 23 of diameter $D_3$. $D_3$ is selected to have a value such that the furthermost peripheral gear teeth on all the gears 42, that is, the gear teeth furthermost from a longitudinal axis of shaft 18, define an effective composite pitch circle of diameter $D_2$ which is equal in value to the pitch diameter $D_1$ of gear 59. Since disk 23 and gear 59 are rotatably attached to shaft 18 and since the aforementioned gear teeth of gear 42 and gear 59 define pitch circles of equal diameters, when a channel select force is coupled to knob 60, the teeth on gear 42 will rotate about shaft 18 with a tangential velocity equal to the tangential velocity of the similarly rotating gear teeth of gear 59. Therefore, there will be no relative velocity between the teeth on gears 42 and 59 during a channel select operation and although idle gears 43 and 44 rotate about their axis on shaft 45, the gears 42 will remain rotationally stationary relative to disk 23 about their individual longitudinal axis. This constitutes an "idle" engagement wherein the fine tuning elements remain at previously adjusted positions during channel selection. However, because shaft 58 may be rotated independently of shaft 18, as described hereinbefore, when a rotational force is applied only to shaft 58, a relative velocity exists between shaft 58 and disk 23 when a rotational fine tuning force is coupled to shaft 58 and a relative velocity will therefore exist between the teeth of gear 59 and gears 42. Thus, a gear "driven" engagement will exist and a rotational force will be coupled between shaft 58 and a "memory" element associated with the channel being tuned.

Subsequent to a fine tuning adjustment and prior to one complete revolution of the selector shaft 18 without further fine tuning adjustments, the possibility of a maximum misalignment of one-half gear tooth between gears 42 and 43 exists. If misalignment exists and gears 42 and 43 are parly mismeshed upon engagement, the gear 42 will be rotated slightly about its axis by a force exerted upon it by gear 43 until meshing between the gear pair occurs. The maximum angular rotation of gear 42 under these conditions will be one-half of one gear tooth. This angular rotation causes an incidental longitudinal motion of a "memory" element 41. The resulting longitudinal motion of element 41 may be attenuated and the effect of the misalignment may be rendered insignificant upon fine tuning by utilizing a relatively fine screw thread for element 41. Furthermore, although conventional spur gear teeth will provide satisfactory operation in the embodiment described during the referred to misalignment, I have found that a smoother meshing operation between the gears of gear pair 42, 43 will occur when gears 42 and 43 are provided with gear teeth having pointed tips as illustrated in FIGURE 7.

Various modifications of the above described embodiment may be made by those skilled in the art. For example, the dimension $D_3$ may be selected to provide an effective pitch circle for the gear teeth of gear 42 which are radially closest to the longitudinal axis of shaft 18. With this variation, the idle gears 43 and 44 would be positioned within the effective composite pitch circle rather than outside the effective composite pitch circle of FIGURE 4. The fine tuning gear 59 would be an internal gear and would, of course, be adjusted in dimension to have a pitch circle equal to the referred-to inner effective pitch circle of gear 42.

Although I have illustrated and described the present invention in connection with a turret type tuner having "memory" elements as integral portions of fine tuning ferromagnetic slugs, various modifications will occur to those skilled in the art without departing from the spirit of my invention. For example, the "memory" elements need not be integrally connected to the slugs, nor is it necessary that a turret tuner arrangement be utilized. As illustrated in Patent Number 2,901,615, which is assigned to the assignee of the present invention, a single fine tuning push-rod may be operated by independent "memory" elements positioned on a "memory" disk.

While I have illustrated and described and have pointed out in the annexed claims certain novel features of my invention, it will be understood that various omissions, substitutions and changes in the forms and details of the system illustrated may be made without departing from the spirit of the invention and scope of the claims.

I claim:

1. An apparatus for providing fine tuning of a television receiver comprising: a tuner having means for individually tuning a plurality of channels and including a rotatably mounted channel selector shaft coupled to said tuning means for individually selecting a desired channel; a fine tuning shaft positioned relative to said channel selector shaft; means, including a means for mechanically coupling said channel selector shaft to said fine tuning shaft, for providing simultaneous rotation of both shafts when a rotational channel selecting force is coupled only to said channel selector shaft and for providing independent rotation of said fine tuning shaft relative to said channel selector shaft when a rotational fine tuning force is coupled to said fine tuning shaft; a disk mounted on said channel selector shaft and rotatable therewith; a plurality of fine tuning memory elements adjustably mounted on said disk; means for transforming an adjusted position of a memory element into an electrical impedance for causing fine tuning of a selected channel; and a drive train for coupling a fine tuning force from said fine tuning shaft to a memory element for causing positional adjustment of the element when said fine tuning shaft is individually rotated, said drive train adapted for continuous engagement when said channel selector shaft is positioned for selecting an individual channel and for substantially sustaining the elements in preselected positions when said channel selector shaft is being rotated.

2. The apparatus of claim 1 wherein said memory elements are mounted on said disk for adjustment of longitudinal position.

3. The apparatus of claim 1 wherein said drive train comprises: a gear-train including a fine tuning gear coupled to said fine tuning shaft for rotation therewith and having a pitch circle of diameter $D_1$; gear teeth disposed about the surface of each of said memory elements for coupling a rotational force to the elements; said memory elements positioned a distance from a longitudinal axis of said channel selector shaft for causing the teeth on said elements to describe an effective composite pitch circle of diameter $D_2$; said diameters $D_1$ and $D_2$ having the relation $$D_1=D_2$$

and idle gear means intercoupling said element gear teeth and said fine tuning gear.

4. An apparatus for providing fine tuning of a television receiver comprising: a tuner having means for individually tuning a plurality of channels and including a rotatably mounted channel selector shaft coupled to said tuning means for selecting a desired channel; a fine tuning shaft positioned relative to said channel selector shaft; a detent mechanism for providing a detenting force $F_1$ for securing said channel selector shaft in a fixed one of a plurality of channel tuning positions; means providing a frictional coupling force $F_2$ between said fine tuning and channel selector shafts; said forces $F_1$ and $F_2$ having the relation $$F_1>F_2$$

said force $F_2$ having a magnitude sufficient for causing simultaneous rotation of said fine tuning shaft with said channel selector shaft when said channel selector shaft is rotated; a fine tuning gear having a pitch circle of diameter $D_1$ coupled to said tuning shaft; an annular memory disk rotatably mounted upon said selector shaft; said memory disk including a plurality of circular apertures extending through a thickness of said disk and equally spaced about a surface of said disk on a circle of diameter $D_3$; a memory element disposed in each of said apertures for longitudinal movement therein; gear teeth disposed about the surface of each of said elements; said diameter $D_3$ having a value for causing the teeth on said elements furthermost from an axis of said selector shaft to define an effective composite pitch circle of diameter $D_2$; said diameters $D_1$ and $D_2$ have the relation $$D_1=D_2$$

rotatably mounted first and second idle gears positioned for continuously intercoupling the gear teeth of a memory element associated with a channel being tuned and said fine tuning gear when said selector shaft is positioned for selecting an individual channel; and means for transforming the longitudinal position of a memory element associated with a channel being tuned into an electrical impedance for causing fine tuning of the receiver.

5. An apparatus for providing fine tuning of a television receiver comprising: a tuner having means for individually tuning a plurality of channels and including a rotatably mounted channel selector shaft coupled to said tuning means for selecting a desired channel; a channel selector knob having a generally cylindrical shape and including a longitudinal cavity for positioning the selector knob on the channel selector shaft for rotation therewith and an annular cross sectional friction surface; a fine tuning tubular shaft of generally cylindrical shape for positioning coaxially with and about a portion of said selector knob and including a cross sectional friction surface; an annular disk spring positioned coaxially with said knob and tuning shaft intermediate said friction surfaces; means for securing said knob and tuning shaft in fixed longitudinal positional relation; a detent mechanism for securing said selector shaft in one of a plurality of channel tuning positions; an annular memory disk mounted on said selector shaft and rotatable therewith; a plurality of fine tuning memory elements positioned on said disk and adjustably mounted for longitudinal motion; means for transforming the longitudinal position of an element into an electrical impedance for causing fine tuning of the receiver; and means for coupling a fine tuning force from said fine tuning shaft to a memory element for causing longitudinal motion of a memory element when said tuning shaft is rotated; said latter coupling means adapted for providing continuous engagement when said channel selector shaft is positioned for selecting an individual channel and for substantially sustaining the memory elements in preselected longitudinal positions when said channel selector shaft is being rotated.

6. A system for providing channel selection and fine tuning in a television receiver comprising: a tuner having means for individually tuning a plurality of channels; a channel selector shaft rotatably mounted on said tuner and coupled to said tuning means for individually selecting said channels; a fine tuning shaft; means for providing simultaneous rotation of both shafts when a rotational channel selecting force is coupled to said channel selector shaft and rotation of only said fine tuning shaft when a rotational fine tuning force is coupled to said fine tuning shaft; adjustable electrical impedance means mounted on said tuner for providing fine tuning of a selected channel, said impedance means having an element adapted for adjustment of its position to cause fine tuning; and means for coupling a fine tuning force from said fine tuning shaft to said adjustable impedance element for adjusting the position of said element, said latter coupling means including means providing continuously engaged coupling between said fine tuning shaft and said impedance element when said channel selector shaft is positioned for selecting an individual channel and adapted for substantially sustaining said impedance element in an adjusted position when said fine tuning shaft is simultaneously rotated with said channel selector shaft.

7. An apparatus for providing fine tuning of a television receiver comprising: a tuner having means for individually tuning a plurality of channels and including a rotatably mounted channel selector shaft coupled to said tuning means for individually selecting a desired channel; a fine tuning shaft positioned relative to said channel selector shaft and having a force coupling means, including a means for mechanically coupling said channel selector shaft to said fine tuning shaft, for providing simultaneous rotation of both said shafts when a rotational channel selecting force is coupled to said channel selector shaft and for providing independent rotation of said fine tuning shaft when a fine tuning rotational force is coupled to said fine tuning shaft; a disk mounted on said channel selector shaft and rotatable therewith; a plurality of fine tuning memory elements adjustably mounted on said disk; said elements each having frictional means for coupling a force thereto for causing positional adjustment thereof; means for transforming an adjusted position of a memory element into an electrical impedance for causing fine tuning of a selected channel; and friction force coupling means for providing continuous coupling of a fine tuning force from said fine tuning shaft friction means to the friction means of one of said memory elements when said channel selector is positioned for selecting an individual channel and for substantially maintaining each of said elements in an adjusted position when said channel selector shaft is being rotated.

8. The apparatus of claim 7 when said channel selector and fine tuning shafts are concentrically positioned.

9. The apparatus of claim 1 wherein said fine tuning force coupling means comprises: a gear-train including a fine tuning gear coupled to said fine tuning shaft for rotation therewith and having a pitch circle of diameter $D_1$; gear teeth disposed about the surface of each of said memory elements for coupling a rotational force to the elements; said memory elements positioned a distance from a longitudinal axis of said channel selector shaft for causing the teeth on said elements to describe an effective composite pitch circle of diameter $D_2$; and idle gear means for coupling said fine tuning gear to said element gear teeth; said idle gear means providing continuously engaged coupling when said channel selector shaft is positioned for selecting an individual channel, said idle gear means having a pitch circle for providing substantially zero angular rotation of the memory elements about their individual axis when said fine tuning shaft is rotated simultaneously with said channel selector shaft.

10. The apparatus of claim 8 wherein said idle gear means comprises a single gear arranged for providing continuous engagement between said fine tuning gear and an element when said channel selector shaft is positioned for selecting an individual channel, said idle gear having a pitch circle adapted for providing substantially zero angular rotation of said memory elements about their individual axis when said channel selector shaft is being rotated.

11. The apparatus of claim 3 wherein said idle gear means comprises first and second gears each having a same pitch circle, said first and second idle gears mounted on said tuner in a manner for providing continuous engagement between said fine tuning gear and one of said elements when said channel selector shaft is positioned for selecting an individual channel.

References Cited in the file of this patent

UNITED STATES PATENTS

| | | |
|---|---|---|
| 924,937 | Richards | June 15, 1909 |
| 2,320,808 | Van Lammern | June 1, 1943 |
| 2,436,418 | Bradford | Feb. 24, 1948 |
| 2,745,918 | Stewart | May 15, 1956 |
| 2,981,838 | Poskozim | Apr. 25, 1961 |
| 3,058,075 | Polley | Oct. 9, 1962 |